United States Patent
Chen et al.

(10) Patent No.: US 10,340,704 B2
(45) Date of Patent: *Jul. 2, 2019

(54) SWITCH DEVICE WITH A WIDE BANDWIDTH

(71) Applicant: RichWave Technology Corp., Taipei (TW)

(72) Inventors: Chih-Sheng Chen, Taipei (TW); Ching-Wen Hsu, Taipei (TW)

(73) Assignee: RichWave Technology Corp., Taipei (TW)

(*) Notice: Subject to any disclaimer, the term of this patent is extended or adjusted under 35 U.S.C. 154(b) by 183 days.

This patent is subject to a terminal disclaimer.

(21) Appl. No.: 15/404,215

(22) Filed: Jan. 12, 2017

(65) Prior Publication Data

US 2017/0126017 A1  May 4, 2017

Related U.S. Application Data

(63) Continuation-in-part of application No. 15/012,859, filed on Feb. 2, 2016, now Pat. No. 9,577,631.

(30) Foreign Application Priority Data

Feb. 13, 2015 (TW) .............................. 104104897 A

(51) Int. Cl.
*H03K 17/16* (2006.01)
*H04B 1/44* (2006.01)
(Continued)

(52) U.S. Cl.
CPC .............. *H02J 4/00* (2013.01); *H03K 17/693* (2013.01)

(58) Field of Classification Search
CPC ................................. H02J 4/00; H03K 17/693
See application file for complete search history.

(56) References Cited

U.S. PATENT DOCUMENTS 3,614,327 A * 10/1971 Low ...................... G08C 15/06
327/408
6,804,502 B2  10/2004 Burgener
(Continued)

FOREIGN PATENT DOCUMENTS

CN  101465454 A  6/2009
CN  101820088 A  9/2010
(Continued)

*Primary Examiner* — Kenneth B Wells
(74) *Attorney, Agent, or Firm* — Winston Hsu

(57) ABSTRACT

A switch device includes a common terminal and a selection circuit. The selection circuit includes a primary switch, a first secondary switch, and a second secondary switch. The primary switch includes a plurality of primary transistors coupled in series and is coupled to the common terminal. The first secondary switch is coupled to the primary switch and a first transmission terminal. The first secondary switch includes a plurality of first secondary transistors coupled in series. The second secondary switch is coupled to the primary switch and a second transmission terminal. The second secondary switch includes a plurality of second secondary transistors coupled in series. The number of the first secondary transistors and the number of the second secondary transistors are both greater than or equal to the number of the primary transistors.

21 Claims, 9 Drawing Sheets

(51) Int. Cl.
    *H01P 1/15*     (2006.01)
    *H02J 4/00*     (2006.01)
    *H03K 17/693*     (2006.01)

(56) References Cited

U.S. PATENT DOCUMENTS

| | | | |
|---|---|---|---|
| 7,307,490 B2 * | 12/2007 | Kizuki | H01P 1/15 333/101 |
| 7,492,238 B2 * | 2/2009 | Nakatsuka | H01P 1/15 333/101 |
| 7,515,882 B2 | 4/2009 | Kelcourse | |
| 8,803,632 B2 | 8/2014 | Takeuchi | |
| 2003/0003881 A1 | 1/2003 | Anim-Appiah | |
| 2003/0090313 A1 | 5/2003 | Burgener | |
| 2004/0141470 A1 | 7/2004 | Kelcourse | |
| 2007/0103252 A1 | 5/2007 | Nakatsuka | |

FOREIGN PATENT DOCUMENTS

| | | |
|---|---|---|
| CN | 201674474 U | 12/2010 |
| CN | 102468836 A | 5/2012 |
| CN | 103401531 A | 11/2013 |
| CN | 203775175 U | 8/2014 |
| CN | 203788253 U | 8/2014 |
| JP | 2008263523 A | 10/2008 |
| JP | 201081250 A | 4/2010 |
| JP | 201115289 A | 1/2011 |
| TW | 227074 | 7/1994 |

* cited by examiner

SWITCH DEVICE WITH A WIDE BANDWIDTH

CROSS REFERENCE TO RELATED APPLICATION

This application is a continuation-in-part application of U.S. patent application Ser. No. 15/012,859 filed on Feb. 2, 2016.

TECHNICAL FIELD

This invention is related to a switch device, and more particularly, a switch device with a wide frequency bandwidth.

BACKGROUND

FIG. 1 shows a single-pole multi-throw switch according to prior art. The single-pole multi-throw switch 100 includes four selection circuits 1101 to 1104 and the single-pole multi-throw switch 100 can transmit or receive signals required by the system by turning on one selection circuit among the four selection circuits 1101 to 1104. For example, when the single-pole multi-throw switch 100 is applied to a wireless communication system, the four selection circuits 1101 to 1104 can be coupled to different wireless communication modules 1301 to 1304 respectively so the single-pole multi-throw switch 100 can be used to transmit radio frequency signals to the related wireless communication module.

Each of the selection circuits 1101 to 1104 includes a plurality of selection transistors 120. When the system uses the single-pole multi-throw switch 100 to transmit signals, only one selection circuit is turned on. For example, when the system uses the single-pole multi-throw switch 100 and the wireless communication module 1301 to transmit signals, the selection transistors 120 of the selection circuit 1101 are turned on, and the selection transistors 120 of the other selection circuits 1102 to 1104 are all turned off. Each of the selection circuits 1102 to 1104 includes 14 selection transistors 120. If the effective capacitance of each of the selection transistors 120 is C, then the effective capacitance of the selection circuit 1102 will be the effective capacitance of 14 selection transistors 120 coupled in series, that is C/14, and the effective capacitance of the selection circuits 1102-1104 will be 3 C/14. Namely, when the system uses the selection circuit 1101 to transmit signals, the effective capacitance of turned-off transistors of the selection circuits 1102 to 1104 is the parasitic capacitance and excessive parasitic capacitance can weaken the strength of the transmission signals. In addition, the selection circuits 1102-1104 may require a significant size of area, which can be in conflict with the needs of mobile electronic devices.

Moreover, when the single-pole multi-throw switch 100 includes even more selection circuits, the required area will also increase. For example, according to the structure of the single-pole multi-throw switch 100 in FIG. 1, the size of area may increase significantly when the single-pole multi-throw switch 100 is expanded to include eight selection circuits. Therefore, how to reduce the parasitic capacitance and the required area of the single-pole multi-throw switch has become a critical issue to be solved.

SUMMARY

One embodiment of the present invention discloses a switch device. The switch device includes a common terminal and a selection circuit. The selection circuit includes a primary switch, a first secondary switch, and a second secondary switch.

The primary switch includes a plurality of primary transistors coupled in series and is coupled to the common terminal. The first secondary switch is coupled to the primary switch and a first transmission terminal. The first secondary switch includes a plurality of first secondary transistors coupled in series. The second secondary switch is coupled to the primary switch and a second transmission terminal. The second secondary switch includes a plurality of second secondary transistors coupled in series. The number of the first secondary transistors and the number of the second secondary transistors are both greater than or equal to the number of the primary transistors.

Another embodiment of the present invention discloses a power divider. The power divider includes an input terminal, and a first selection circuit. The input terminal is for receiving a power source. The first selection circuit includes a first primary switch, a first secondary switch, and a second secondary switch.

The first primary switch includes at least one first primary transistor coupled to the input terminal. The first secondary switch is coupled to the first primary switch and a first output terminal for outputting a portion of the power source. The first secondary switch includes at least one first secondary transistor. The second secondary switch is coupled to the first primary switch and a second output terminal for outputting a portion of the power source. The second secondary switch includes at least one second secondary transistor.

Another embodiment of the present invention discloses a signal combiner. The signal combiner includes an output terminal, and a first selection circuit. The output terminal is for outputting a combined signal. The first selection circuit includes a first primary switch, a first secondary switch, and a second secondary switch.

The first primary switch includes at least one first primary transistor coupled to the output terminal. The first secondary switch is coupled to the first primary switch and a first input terminal for receiving a first signal. The first secondary switch includes at least one first secondary transistor. The second secondary switch is coupled to the first primary switch and a second input terminal for receiving a second signal. The second secondary switch includes at least one second secondary transistor.

DETAILED DESCRIPTION

Figure 1:
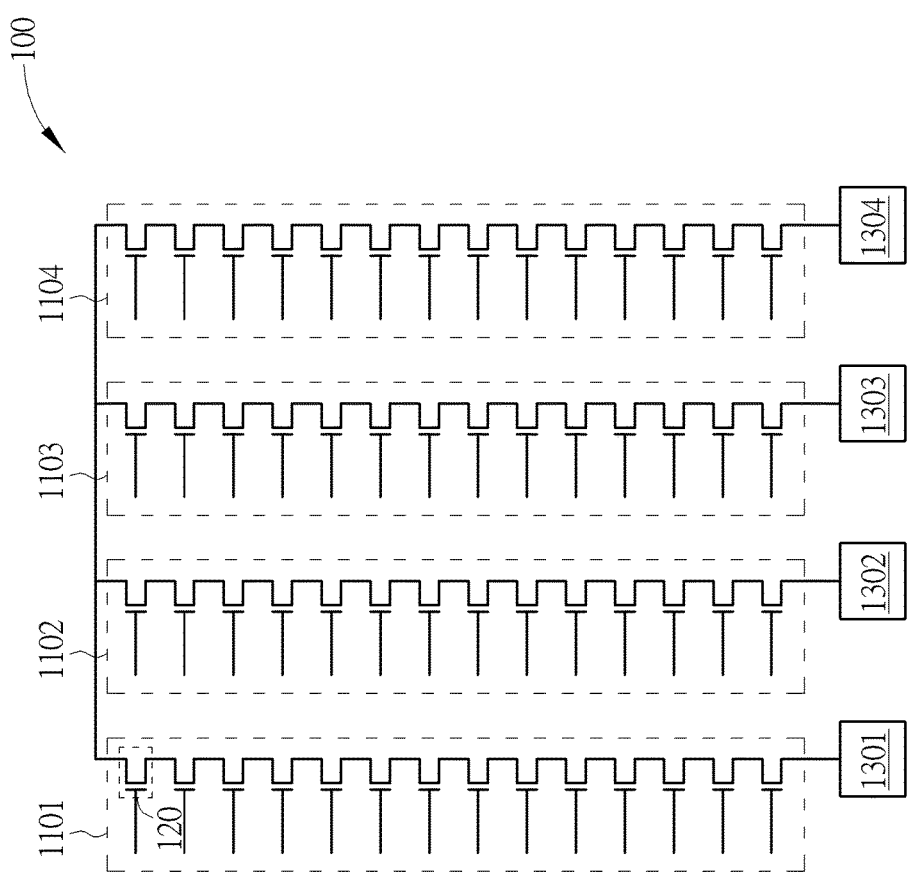
FIG. 1 shows a single-pole multi-throw switch according to prior art.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
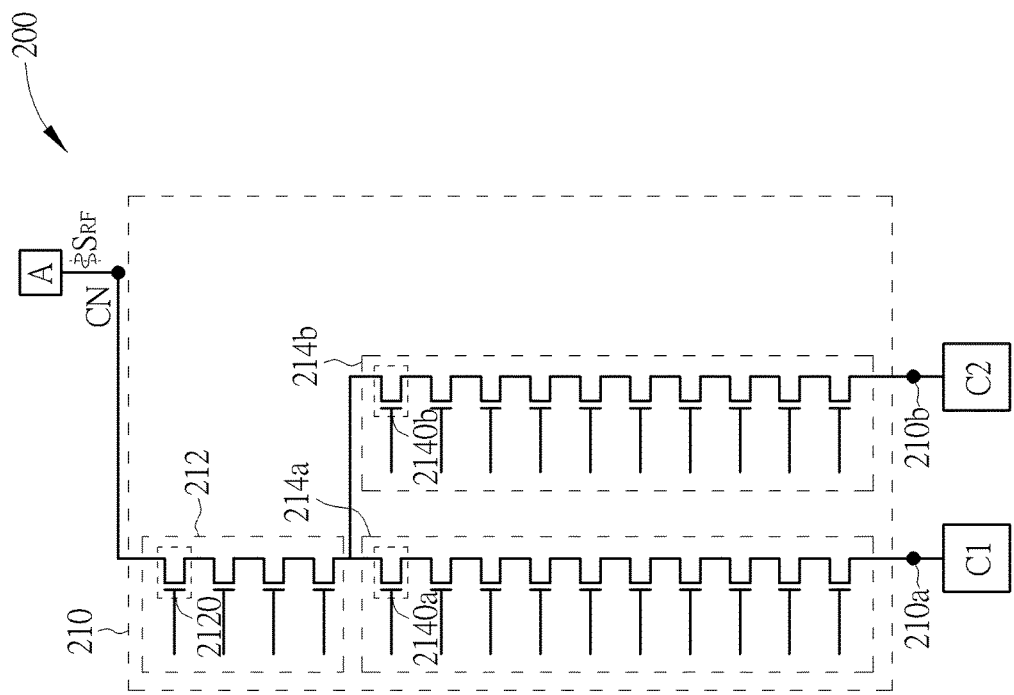
FIG. 2 shows a switch device according to one embodiment of the present invention.

FIG. 2 shows a switch device 200 according to one embodiment of the present invention. The switch device 200 includes a common terminal CN and a selection circuit 210. The selection circuit 210 includes a primary switch 212, a secondary switch 214a, and a secondary switch 214b. The common terminal CN can be used to transmit radio frequency (RF) signals $S_{RF}$. According to the embodiment in FIG. 2, the switch device 200 can be applied to a wireless communication system so the common terminal CN can be coupled to an antenna terminal A for receiving or transmitting radio frequency signals $S_{RF}$. However, this is not to limit the scope of the present invention.

The primary switch 212 includes a plurality of first primary transistors 2120 coupled in series and the primary switch 212 is coupled to the common terminal CN. The secondary switch 214a can be coupled to the primary switch 212 and a transmission terminal 210a. The secondary switch 214a can include a plurality of secondary transistors 2140a coupled in series. When the primary transistors 2120 and the secondary transistors 2140a are turned on, the radio frequency signals $S_{RF}$ can be transmitted through the primary switch 212, the secondary switch 214a, and the transmission terminal 210a. The secondary switch 214b can be coupled to the primary switch 212 and a transmission terminal 210b. The secondary switch 214b can include a plurality of secondary transistors 2140b coupled in series. When the primary transistors 2120 and the secondary transistors 2140b are turned on, the radio frequency signals $S_{RF}$ can be transmitted through the primary switch 212, the secondary switch 214b, and the transmission terminal 210b. In some embodiments of the present invention, the primary transistors 2120, the secondary transistors 2140a and the secondary transistors 2140b can be P-type metal-oxide semiconductor transistors (PMOSs), NMOS or other kinds of transistors.

In some embodiments of the present invention, the transmission terminals 210a and 210b can be coupled to wireless radio frequency terminals C1 and C2 respectively so when the system needs to transmit the radio frequency signals $S_{RF}$ through the antenna terminal A and the wireless radio frequency terminal C1, the plurality of primary transistors 2120 and the plurality of secondary transistors 2140a can be turned on and the transmission terminal 210a can be used to transmit or receive the radio frequency signals $S_{RF}$ accordingly. Similarly, when the system needs to transmit the radio frequency signals $S_{RF}$ through the antenna terminal A and the wireless radio frequency terminal C2, the plurality of primary transistors 2120 and the plurality of secondary transistors 2140b can be turned on and the transmission terminal 210b can be used to transmit or receive the radio frequency signals $S_{RF}$ accordingly.

By sharing the primary transistors 2120, the circuit area required by the switch device 200 can be less than the circuit area required by the single-pole multi-throw switch of the prior art (such as the selection circuits 1101 and 1102 of the single-pole multi-throw switch 100).

In addition, the plurality of secondary transistors 2140a can receive the same control signals for being turned on or turned off simultaneously, and plurality of secondary transistors 2140b can also receive the same control signals for being turned on or turned off simultaneously. When using the transmission terminal 210a to transmit the radio frequency signals $S_{RF}$, the plurality of secondary transistors 2140a can be turned on so the voltage endured by the plurality of the primary transistors 2120 and the plurality of secondary transistors 2140a can be the voltage amplitudes of the radio frequency signal $S_{RF}$. Also, since the plurality of secondary transistors 2140b will be turned off, the total voltage endured by the plurality of secondary transistors 2140b will be the same as the total voltage endured by the plurality of the secondary transistors 2140a. Since the radio frequency signals are usually high frequency signals with high voltage, to prevent the plurality of secondary transistors 2140b of the secondary switch 214b from unintentionally being turned on by the drastic variation of the radio frequency signals $S_{RF}$, the number of the secondary transistors 2140b of the secondary switch 214b can be greater than or equal to the number of the primary transistors 2120 of the primary switch 212 in some embodiments of the present invention. Similarly, the number of the secondary transistors 2140a of the secondary switch 214a can also be greater than or equal to the number of the primary transistors 2120 of the primary switch 212.

Furthermore, if the primary transistors 2120 and the secondary transistors 2140a and 2140b are controlled by positive voltages, then direct currents (DC) may be required to bias the sources and drains of the primary transistors 2120, and the secondary transistors 2140a and 2140b due to the parasitic capacitors of the primary transistors 2120, and the secondary transistors 2140a and 2140b. In this case, additional capacitors will also be added at the input or output of the switch device 200 for blocking the direct currents.

In some embodiments, the primary transistors 2120, and the secondary transistors 2140a and 2140b can be controlled by negative voltages so the parasitic capacitors will not be charged and no additional bias voltage would be needed. For example, if the primary transistors 2120, and the secondary transistors 2140a and 2140b are NMOS, the primary transistors 2120, and the secondary transistors 2140a and 2140b can be turned off by applying a negative voltage, such as −2.8V, to the gates. Also, with the high amplitude of the radio frequency signal $S_{RF}$, the secondary transistors 2140a and 2140b can be turned on by applying the ground voltage, such as 0V. In this case, no DC bias would be applied to the primary transistors 2120, and the secondary transistors 2140a and 2140b; therefore, no additional capacitors would be needed, either. That is, the common terminal CN, the first transmission terminal 210a, and the second transmission terminal 210b can be coupled to an external circuit directly without additional capacitors. Consequently, the overall area can be further reduced.

Figure 3:
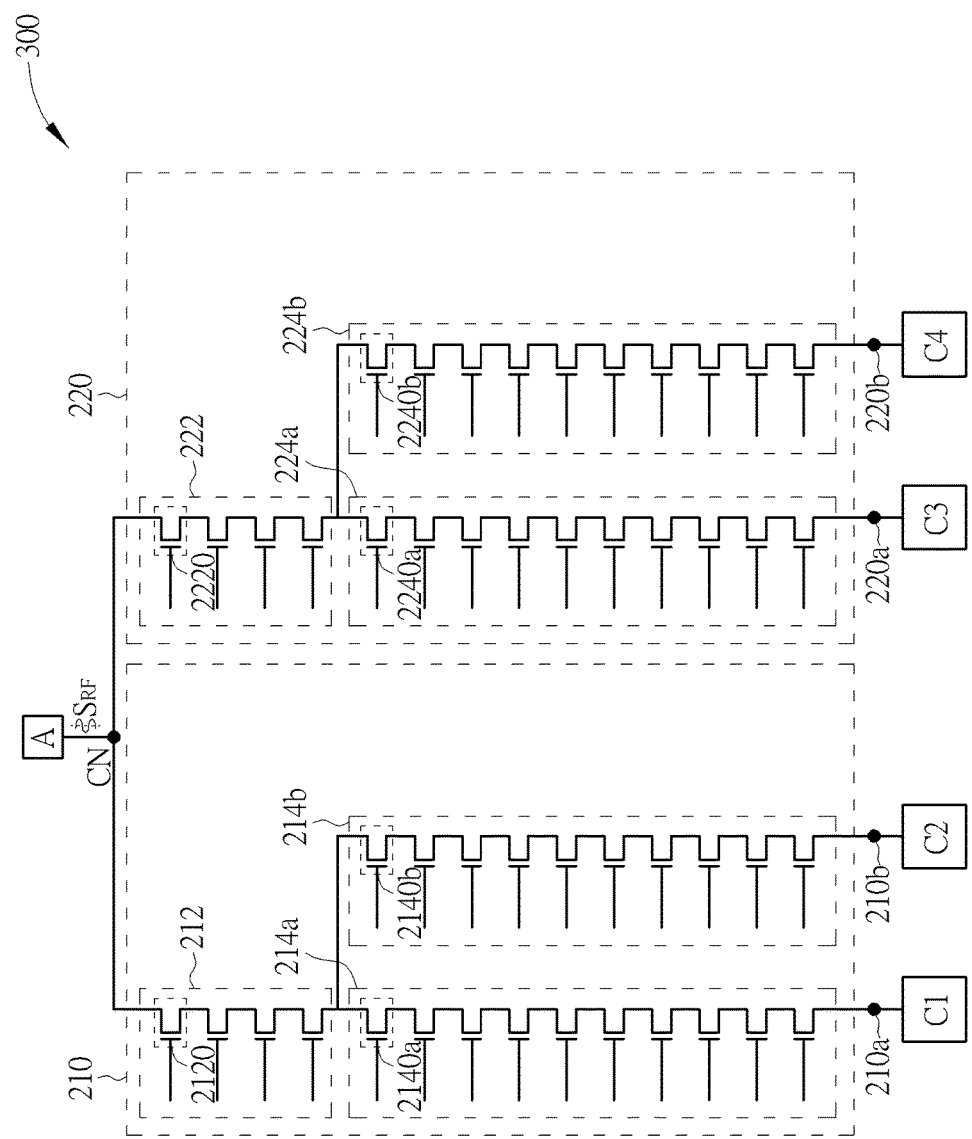
FIG. 3 shows a switch device according to another embodiment of the present invention.

FIG. 3 shows a switch device 300 according to another embodiment of the present invention. The switch device 300 can have a similar structure as the switch device 200. The difference between these two switch devices is in that the switch device 300 not only includes the common terminal CN and the selection circuit 210 but also includes a selection circuit 220. The selection circuit 220 includes a primary switch 222, a secondary switch 224a, and a secondary switch 224b. The primary switch 222 can include a plurality of primary transistors 2220 coupled in series and the primary switch 222 is coupled to the common terminal CN. The secondary switch 224a can be coupled to the primary switch 222 and a transmission terminal 220a. The secondary switch 224a can include a plurality of secondary transistors 2240a coupled in series. When the primary transistors 2220 and the secondary transistors 2240a are turned on, the radio frequency signals $S_{RF}$ can be transmitted through the primary switch 222, the secondary switch 224a, and the transmission terminal 220a. The secondary switch 224b can be coupled to the primary switch 222 and a transmission terminal 220b. The secondary switch 224b can include a plurality of secondary transistors 2240b coupled in series. When the primary transistors 2220 and the secondary transistors 2240b are turned on, the radio frequency signals $S_{RF}$ can be transmitted through the primary switch 222, the secondary switch 224b, and the transmission terminal 220b.

Since the total number of transistors in the switch device 300 is smaller than the total number of transistors in the single-pole multi-throw switch 100, the circuit area required by the switch device 300 can also be smaller than the circuit area required by the single-pole multi-throw switch 100.

In some embodiments of the present invention, the transmission terminals 210a, 210b, 220a and 220b can be coupled to the corresponding wireless radio frequency terminals C1, C2, C3 and C4 respectively, so the transmission path of the radio frequency signals can be determined by turning on or off the transistors in the selection circuits 210 and 220. For example, when transmitting the radio frequency signals $S_{RF}$ through the antenna terminal A and the wireless radio frequency terminal C3, the plurality of primary transistors 2220 and the plurality of secondary transistors 2240a can be turned on and the plurality of primary transistors 2120, the plurality of secondary transistors 2140a, 2140b, and 2240b can all be turned off so the transmission terminal 220a can be used to transmit or receive the radio frequency signals $S_{RF}$ accordingly.

In this case, the total voltage endured by the plurality of secondary transistors 2240b will be the same as the total voltage endured by the plurality of the secondary transistors 2240a. Since the radio frequency signals are usually high frequency signals with high voltage, to prevent the plurality of secondary transistors 2240b of the secondary switch 224b from unintentionally being turned on by the drastic variation of the radio frequency signals $S_{RF}$, the number of the secondary transistors 2240b of the secondary switch 224b can be greater than or equal to the number of the primary transistors 2220 of the primary switch 222 in the present embodiment. Similarly, the number of the secondary transistors 2240a of the secondary switch 224a can also be greater than or equal to the number of the primary transistors 2220 of the primary switch 222.

In some embodiments of the present invention, when the switch device 300 turns on the primary transistors 2120 and the secondary transistors 2140a and turns off the primary transistors 2220, the secondary transistors 2140b, 2240a, and 2240b, the parasitic capacitance of the switch device 300 can be seen as the effective capacitance of the secondary switch 214b in parallel with the selection circuit 220. For example, if the effective capacitances of the secondary transistors 2140a, 2140b, 2240a, and 2240b are C, the effective capacitances of the primary transistors 2120 and 2220 are also C, the total numbers of the secondary transistors 2140a, 2140b, 2240a, and 2240b are all 10, and the total numbers of the primary transistors 2120 and 2220 are both 4, then the effective capacitance of the secondary switch 214b will be C/10, and the effective capacitance of the selection circuit 220 will be the effective capacitance of the secondary switch 224a (C/10) in parallel with the secondary switch 224b (C/10) and then together in series with the primary switch 222 (C/4), that is C/9. Consequently, in this case, the parasitic capacitance of the switch device 300 will be 19 C/90, which is equal to the effective capacitance of the secondary switch 214b (C/10) in parallel with the selection circuit 220 (C/9). Comparing to the prior art, the parasitic capacitance of the switch device 300 can also be smaller than the parasitic capacitance of the single-pole multi-throw switch 100, which is 3 C/14.

Although in the aforesaid embodiments, the total numbers of the secondary switches 2140a, 2140b, 2240a, and 2240b are all 10, and the total numbers of the primary transistors 2120 and 2220 are both 4, this is not to limit the present invention. In other embodiments of the present invention, the total numbers of the secondary switches 2140a to 2240b and the total numbers of the primary transistors 2120 and 2220 can also be modified according to the system requirement. However, to reduce the parasitic capacitance more effectively for the switch device 300, the numbers of the secondary switches can be two times greater than the number of the primary switches.

In addition, in the aforesaid embodiments, the effective capacitances of each of the secondary transistors 2140a, 2140b, 2240a, and 2240b are C and the effective capacitances of each of the primary transistors 2120 and 2220 are also C, that is, the sizes of the secondary transistors 2140a, 2140b, 2240a, and 2240b can be the same as the sizes of the primary transistors 2120 and 2220. In other embodiments of the present invention, the sizes of the secondary transistors 2140a, 2140b, 2240a, and 2240b can all be the same as each other, and the sizes of the primary transistors 2120 and 2220 can also be the same as each other. However, to reduce the turn-on resistance ($R_{DS(on)}$) on the transmission path and to avoid the required circuit area from increasing, the sizes of the secondary transistors 2140a, 2140b, 2240a, and 2240b can be different from the sizes of the primary transistors 2120 and 2220. For example, the sizes of the primary transistors 2120 and 2220 can be greater than the sizes of the secondary transistors 2140a, 2140b, 2240a, and 2240b so that the turn-on resistance of the primary transistors 2120 and 2220 can be smaller than the turn-on resistance of the secondary transistors 2140a, 2140b, 2240a, and 2240b, and the effective capacitances of the primary transistors 2120 and 2220 can be greater than the effective capacitances of the secondary transistors 2140a, 2140b, 2240a, and 2240b.

Furthermore, since the voltage endured by one transistor is inversely proportional to the effective capacitance of the transistor along the same turn-off path, one can increase the effective capacitances of the primary transistors 2120 and 2220 in some embodiments, for example, the effective capacitance of the primary transistor 2120 can be greater than the effective capacitances of the secondary transistors 2140a and 2140b, and the effective capacitance of the primary transistor 2220 can be greater than the effective capacitances of the secondary transistors 2240a and 2240b so that the voltages endured by the primary transistors 2120 and 2220 can be reduced, the possibility that the primary transistors 2120 and 2220 break down due to the high voltage signals can also be reduced, and the primary transistors 2120 and 2220 can be prevented from being turned on unintentionally by the drastic variation of the radio frequency signals $S_{RF}$. However, in other embodiments, the effective capacitance of the primary transistors 2120 and 2220 can also be decreased. For example, the effective capacitance of the primary transistor 2120 can be smaller than the effective capacitances of the secondary transistors 2140a and 2140b, and the effective capacitance of the primary transistor 2220 can be smaller than the effective capacitances of the secondary transistors 2240a and 2240b so that the voltages endured by the primary transistors 2120 and 2220 can be increased while the voltages endured by the secondary transistors 2140a, 2140b, 2240a and 2240b can be decreased so that the secondary transistors 2140a, 2140b, 2240a and 2240b can be prevented from being turned on unintentionally by the drastic variation of the radio frequency signals $S_{RF}$. To be even more specific, the switch device 300 can choose the primary transistors 2120 and 2220 and the secondary transistors 2140a, 2140b, 2240a, and 2240b to have appropriate effective capacitances and sizes according to the system need to enhance the system stability.

Moreover, to prevent the primary transistor 2120 from breaking down due to the large voltage, the breakdown voltage of each of the primary transistor 2120 can be greater than the breakdown voltage of each of the secondary transistors 2140a and 2140b in other embodiments. Similarly, the breakdown voltage of each of the primary transistor 2220 can also be greater than the breakdown voltage of each of the secondary transistors 2240a and 2240b.

However, if the effective capacitances of the primary transistors 2120 and 2220 are excessively big, then the required circuit area and the parasitic capacitance of the switch device 300 may also be increased. Therefore, users can decide the appropriate sizes for the primary transistors and the secondary transistors according to the system need to optimize the transmission path of the switch device 300. In addition, to ensure each of the transmission paths of the switch device 300 may have the same best optimized result, the number of the primary transistors 2120 and the number of the primary transistors 2220 can be the same and the numbers of the secondary transistors 2140a, 2140b, 2240a, and 2240b can be the same as each other.

Figure 4:
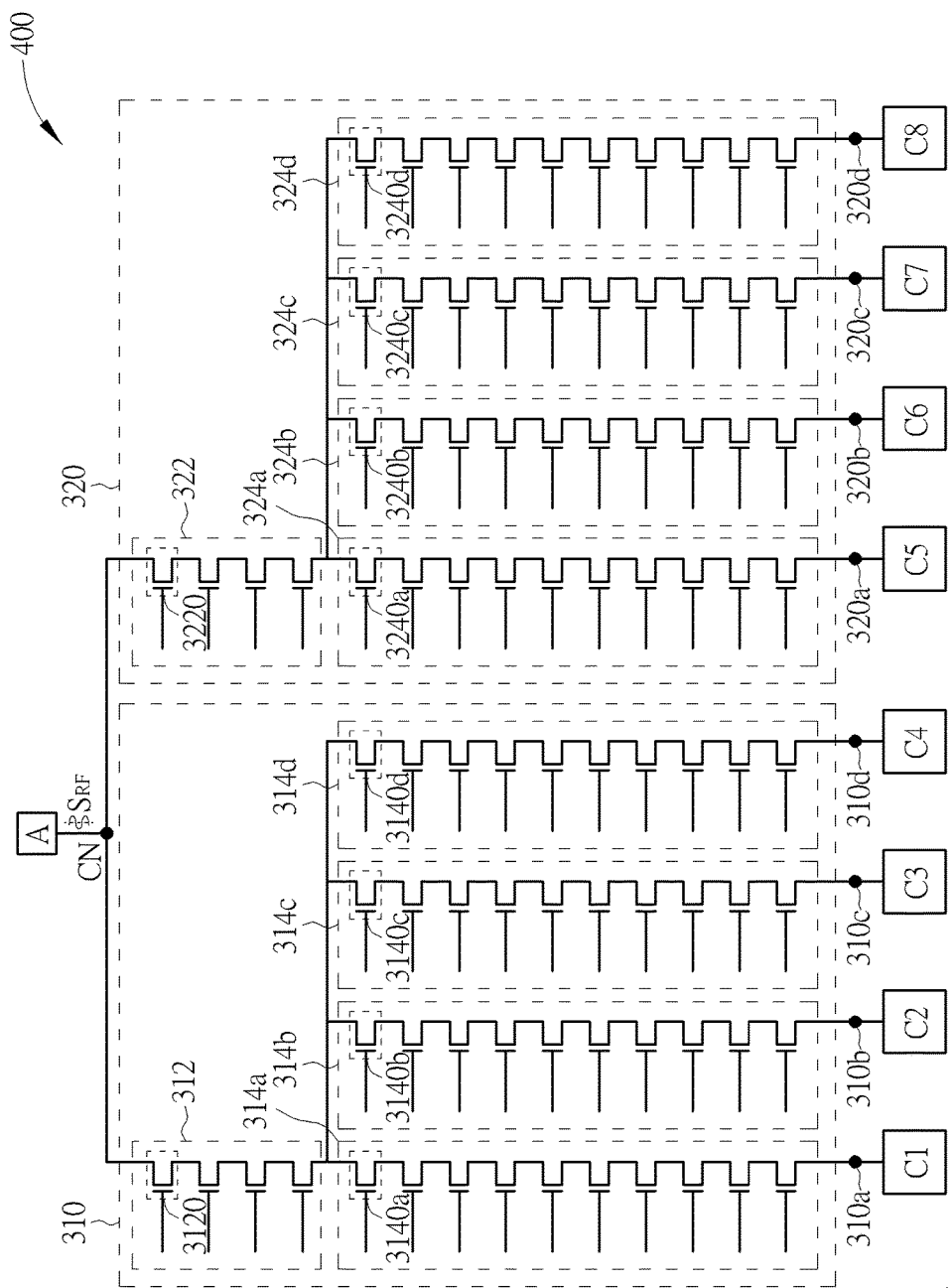
FIG. 4 shows a switch device according to another embodiment of the present invention.

Although the selection circuit 210 of the single-pole multi-throw switch 200 includes two secondary switches 214a and 214b, the present invention is not limited to this embodiment. In other embodiments of the present invention, the single-pole multi-throw switch 200 can also have other numbers of selection circuits and have other numbers of secondary switches in one selection circuit. FIG. 4 shows a single-pole multi-throw switch 400 according to another embodiment of the present invention. The single-pole multi-throw switch 400 includes the common terminal CN, a selection circuit 310, and a selection circuit 320. The selection circuit 310 includes a primary switch 312, a secondary switch 314a, a secondary switch 314b, a secondary switch 314c, and a secondary switch 314d. The selection circuit 320 includes a primary switch 322, a secondary switch 324a, a secondary switch 324b, a secondary switch 324c, and a secondary switch 324d. The four secondary switches 314a, 314b, 314c, and 314d can be coupled to the primary switch 312 and coupled to the transmission terminals 310a, 310b, 310c, and 310d respectively. The four secondary switches 314a, 314b, 314c, and 314d can respectively include a plurality of secondary transistors 3140a coupled in series, a plurality of secondary transistors 3140b coupled in series, a plurality of secondary transistors 3140c coupled in series, and a plurality of secondary transistors 3140d coupled in series. Taking the secondary switch 314a as example, when the plurality of primary transistors 3120 and the plurality of secondary transistors 3140a are turned on, the single-pole multi-throw switch 400 can transmit the radio frequency signals $S_{RF}$ through the primary switch 312, the secondary switch 314a, and the transmission terminal 310a. The secondary switches 314b, 314c, and 314d can have the same structures and the same operation principles as the secondary switch 314a so the redundant explanation is saved. The selection circuit 320 can have the same structure and the same operational principle as the selection circuit 310 so the redundant explanation is saved.

In some embodiments of the present invention, the transmission terminals 310a to 310d and 320a to 320d can be coupled to the wireless radio frequency terminal C1 to C8 correspondingly so that the path for transmitting the radio frequency signals $S_{RF}$ in the single-pole multi-throw switch 400 can be decided by turning on or turning off the transistors in the selection circuits 310 and 320. For example, when using the antenna terminal A and the wireless radio frequency terminal C3 to transmit the radio frequency signals $S_{RF}$, the plurality of primary transistors 3120 and the plurality of secondary transistors 3140c can be turned on and the plurality of primary transistors 3220 and the plurality of secondary transistors 3140a, 3140b, 3140d and 3240a to 3240d can all be turned off so the transmission terminal 310c can be used to transmit or receive the radio frequency signal $S_{RF}$ accordingly.

In some embodiments of the present invention, when the single-pole multi-throw switch 400 turns on the plurality of primary transistors 3120 and the plurality of secondary transistors 3140a and turns off the plurality of primary transistors 3220 and the plurality of secondary transistors 3140b to 3140d and 3240a to 3240d, the parasitic capacitance of the single-pole multi-throw switch 400 can been seen as the capacitance value of the effective capacitance of the three secondary switches 314b to 314d in parallel with the effective capacitance of the selection circuit 320. In some embodiments of the present invention, the sizes of the secondary transistors 3140a to 3140d and 3240a to 3240d can all be the same, and the sizes of the primary transistors 3120 and 3220 can be the same so that the effective capacitances of the secondary transistors 3140a to 3140d and 3240a to 3240d can all be the same as each other and the effective capacitances of the primary transistors 3120 and 3220 can also be the same as each other; however, the effective capacitances of the primary transistors 3120 and 3220 may be different from the effective capacitances of the secondary transistors 3140a to 3140d and 3240a to 3240d. For example, if the effective capacitance of the secondary transistors 3140a to 3140d and 3240a to 3240d are C, the effective capacitances of the primary transistors 3120 and 3220 can be 2 C. In FIG. 4, the numbers of the secondary transistors 3140a to 3140d and 3240a to 3240d are all 10, and the numbers of the primary transistors 3120 and 3220 are both 4. The effective capacitance of the three secondary switches 314d to 314d in parallel is equal to 3 C/10 (where each secondary switch has effective capacitance of C/10), and the effective capacitance of the selection circuit 320 can be seen as the capacitance value of the effective capacitance of the primary switches 322 (C/2) in series with the effective capacitance of the four secondary switches 324a to 324d in parallel (4 C/10) in total. Namely, the effective capacitance of the selection circuit 320 is equal to the capacitance of C/2 in series with the capacitance of 4 C/10 and has the resulted capacitance of 2 C/9. Therefore, the parasitic capacitance of the single-pole multi-throw switch 400 can be the total effective capacitance of the three secondary switches 314b to 314d (3 C/10) in parallel with the effective capacitance of the selection circuit 320 (2 C/9), that is, the parasitic capacitance of the single-pole multi-throw switch 400 can be 47 C/90. Comparing to the prior art, while the single-pole multi-throw switch 100 includes more selection circuits to provide eight different transmission paths for the system with the parasitic capacitance of 7 C/14, the single-pole multi-throw switch 400 has its parasitic capacitor of 47 C/90, which is about the same level as the single-pole multi-throw switch 100. However, since the sizes and effective capacitances of the primary transistors 3120 and 3220 are all greater than the sizes and the effective capacitances of the secondary transistors 3140a to 3140d and 3240a to 3240d, the turn-on resistance on the transmission path can be reduced and the voltage endured by the primary transistors 3120 and 3220 can also be reduced, which can prevent the primary switches 3120 and 3220 from being in breakdown and can prevent the primary switches 3120 and 3220 from being turned on unintentionally due to the drastic variation of radio frequency signals $S_{RF}$.

In the aforesaid embodiments, the effective capacitances of the primary transistors 3120 and 3220 can be two times greater than the effective capacitances of the secondary transistors 3140a to 3140d and 3240a to 3240d; however, this is not to limit the present invention. In other embodiments of the present invention, the effective capacitances of the primary transistors can be adjusted according to the system need. For example, if the system needs to further reduce the parasitic capacitance of the single-pole multi-throw switch and to reduce the required circuit area, the effective capacitances of the primary transistors 3120 and 3220 can be one times, one point five times or other number of times the effective capacitances of the secondary transistors 3140a to 3140d and 3240a to 3240d.

In addition, the number of the primary transistors 3120 and the number of the primary transistors 3220 can be the same and the numbers of the secondary transistors 3140a to 3140d and 3240a to 3240d can be the same as each other so that each of transmission paths of the single-pole multi-throw switch 400 may have the same best optimized result.

To provide eight different transmission paths in the single-pole multi-throw switch, the single-pole multi-throw switch 400 in FIG. 4 includes two selection circuits 310 and 320 and each selection circuit 310 and 320 includes four secondary switches 3140a to 3140d and 3240a to 3240d respectively. However, this is not to limit the present invention. In other embodiments of the present invention, the single-pole multi-throw switch can also include other numbers of selection circuits with other numbers of secondary switches according to the system need. For example, the single-pole multi-throw switch can include four selection circuits and each selection circuit can include two secondary switches so that the single-pole multi-throw switch can still provide eight different transmission paths.

Figure 5:
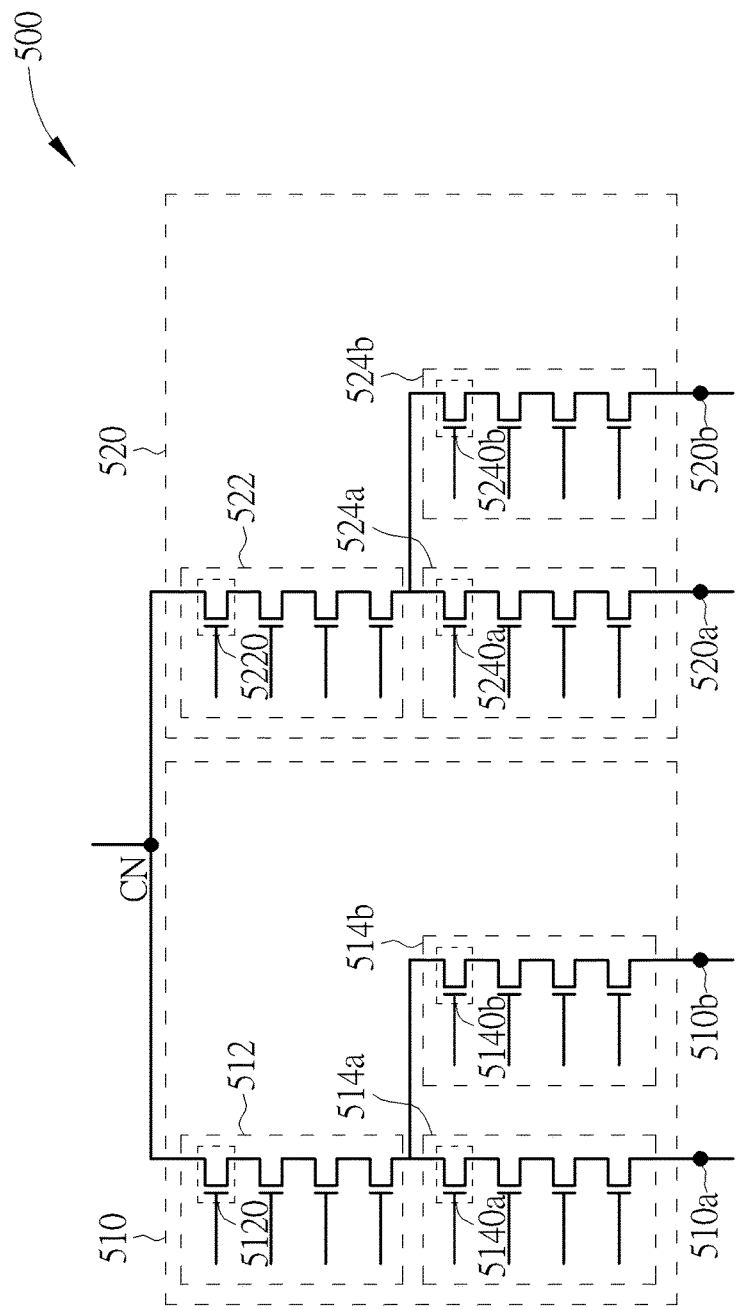
FIG. 5 shows a switch device according to another embodiment of the present invention.

For example, FIG. 5 shows a switch device 500 according to one embodiment of the present invention. The switch device 500 includes a common terminal CN, a first selection circuit 510 and a second selection circuit 520. The first selection circuit 510 includes a first primary switch 512, a first secondary switch 514a coupled to a first transmission terminal 510a, and a second secondary switch 514b coupled to a second transmission terminal 510b. The second selection circuit 520 includes a second primary switch 522, a third secondary switch 524a coupled to a third transmission terminal 520a, and a fourth secondary switch 524b coupled to a fourth transmission terminal 520b. The first primary switch 512 includes a plurality of primary transistors 5120, the second primary switch 522 includes a plurality of primary transistors 5220, the first secondary switch 514a includes a plurality of secondary transistors 5140a, the second secondary switch 514b includes a plurality of secondary transistors 5140b, the third secondary switch 524a includes a plurality of secondary transistors 5240a, and the fourth secondary switch 524b includes a plurality of secondary transistors 5240b.

The switch device 500 has a similar structure as the switch device 300; however, the number of the secondary switches in each of the secondary switches 514a to 524b is equal to the number of the primary switches in each of the primary switches 512 and 522.

Furthermore, in the previous embodiments, the switch devices 200, 300, 400, and 500 can be used to control the transmission path of the radio frequency signal, however, the switch devices 200, 300, 400, and 500 can also be used by other applications.

Figure 6:
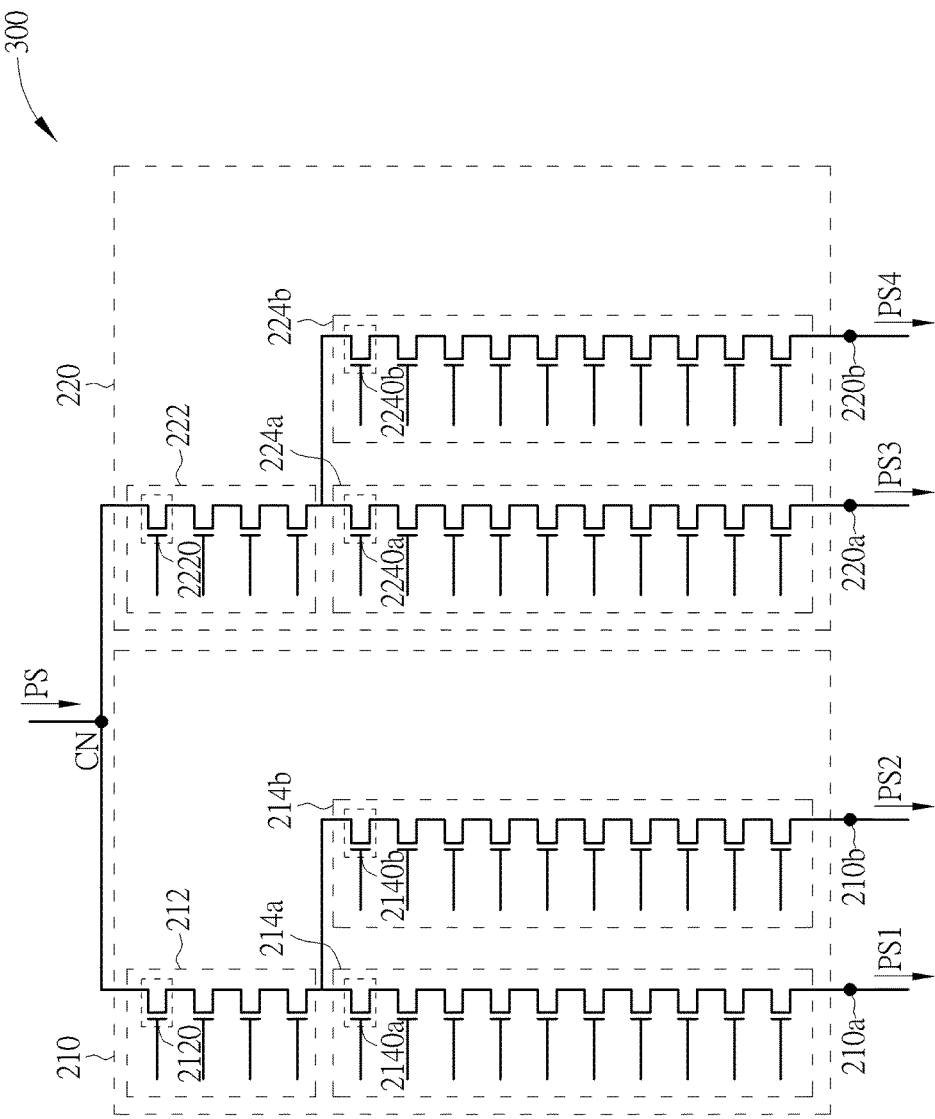
FIG. 6 shows the switch device in FIG. 3 as a power divider according to one embodiment of the present invention.

FIG. 6 shows the switch device 300 being applied as a power divider according to one embodiment of the present invention. In FIG. 6, the common terminal CN of the switch device 300 can be an input terminal for receiving a power source PS. In this case, the switch device 300 can split the power source PS into four power outputs PS1, PS2, PS3, and PS4. That is, each of the first transmission terminal 210a, the second transmission terminal 210b, the third transmission terminal 210c, and the fourth transmission terminal 210d can be the output terminals of the power divider, and each outputs a portion of the power source PS.

Usually, a power divider may be implemented by a transmission line with matched impedances or inductors formed by coils. However, the matched transmission line has a strict limitation about the frequency of power source while the coils of the inductor will require a great chip area. Due to the flexible structure, the switch device 300 can provide a much wider bandwidth than the traditional power dividers while keeping the chip area small. Also, since the switch device 300 is mainly formed by transistors, it can be manufactured by a semiconductor process with other circuits, thereby simplifying the element placement.

In some embodiments, the four power paths provided by the first secondary switch 214a to the fourth secondary switch 224b can be turned on and turned off independently. Therefore, to avoid the primary switches 212 and 222 and the secondary switches 214a to 224b from being turned on by the big swing of the power source unintentionally, each of the primary switches 212 and 222 can include more than one primary transistor coupled in series and each of the secondary switches 214a to 224b can include more than one secondary transistor coupled in series as shown in FIG. 6.

However, in some embodiments, the four power paths formed by the first secondary switch 214a to the fourth secondary switch 224b can be controlled with the same control signals, that is, the transistors in the first secondary switch 214a to the fourth secondary switch 224b can turned on and turned off simultaneously. In this case, no transistor would have to endure the swing of the power source alone. Therefore, at least one primary transistor may be enough for each of the primary switches 212 and 222. Also, at least one secondary transistor may be enough for each of the secondary switches 214a to 224b.

Figure 7:
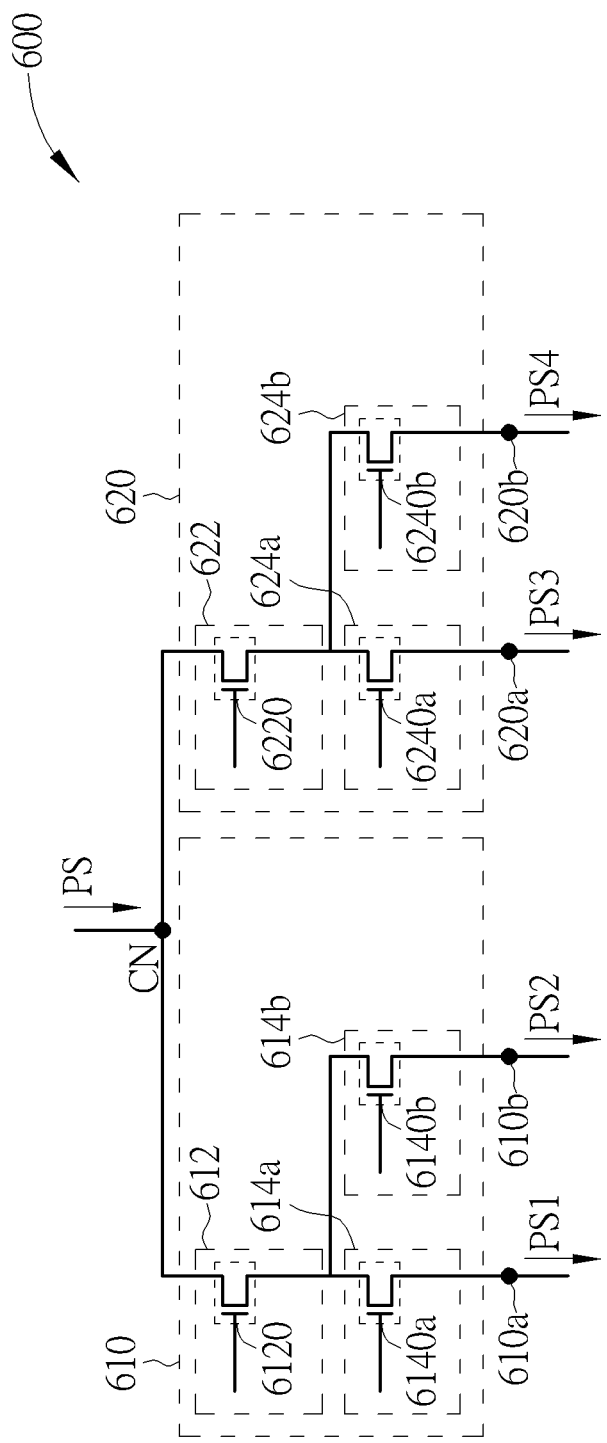
FIG. 7 shows a switch device according to another embodiment of the present invention.

For example, FIG. 7 shows a switch device 600 according to one embodiment of the present invention. The switch device 600 includes a common terminal CN, a first selection circuit 610 and a second selection circuit 620. The first selection circuit 610 includes a first primary switch 612, a first secondary switch 614a, and a second secondary switch 614b. The second selection circuit 620 includes a second primary switch 622, a third secondary switch 624a, and a fourth secondary switch 624b. The common terminal CN can receive a power source PS, and the switch device 600 can be used as a power divider to split the power source PS into four power outputs PS1, PS2, PS3, and PS4 through the transmission terminals 610a to 620b of the first secondary switch 614a to the fourth secondary switch 624b.

In FIG. 7, the first selection circuit 610 and the second selection circuit 620 are controlled by the same control signals so the transistors in the first secondary switch 614a to the fourth secondary switch 624b can turned on and turned off simultaneously. That is, no transistors have to endure the swing of the power source alone. In this case, the first primary switch 612 can include only one primary transistor 6120, the second primary switch 622 can include only one primary transistor 6220, the first secondary switch 614a can include only one secondary transistor 6140a, the second secondary switch 614b can include only one secondary transistor 6140b, the third secondary switch 624a can include only one secondary transistor 6240a, and the fourth secondary switch 624b can include only one secondary transistor 6240b.

Figure 8:
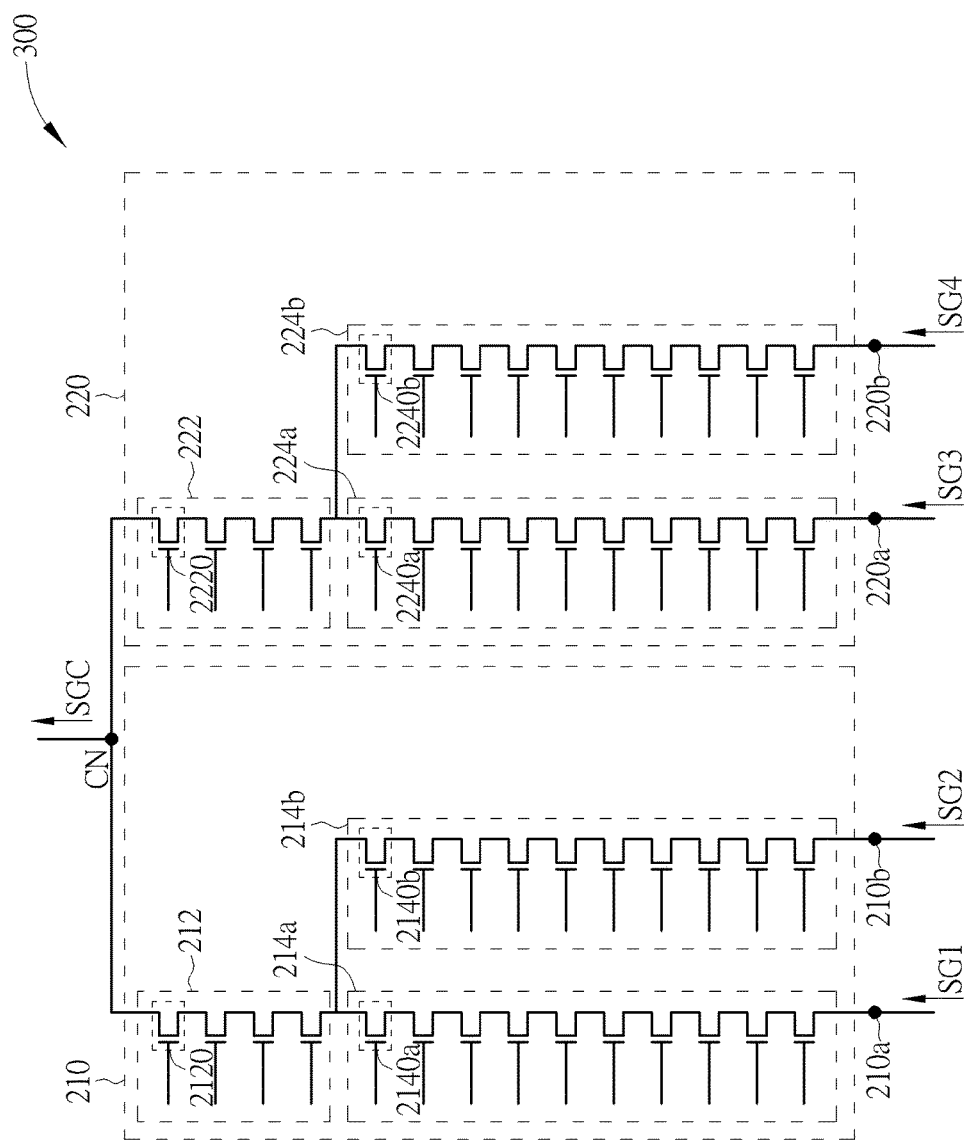
FIG. 8 shows the switch device in FIG. 3 as a signal combiner according to one embodiment of the present invention.

FIG. 8 shows the switch device 300 being applied as a signal combiner according to one embodiment of the present invention. In FIG. 8, each of the first transmission terminal 210a, the second transmission terminal 210b, the third transmission terminal 210c, and the fourth transmission terminal 210d can be an input terminal of the signal combiner, and each receives a corresponding signal. For example, the first transmission terminal 210a may receive a first signal SG1, the second transmission terminal 210b may receive a second signal SG2, the third transmission terminal 220a may receive a third signal SG3, and the fourth transmission terminal 220b may receive a fourth signal SG4. In this case, the switch device 300 can combine the signals SG1 to SG4 received by the first secondary switch 214a, the second secondary switch 214b, the third secondary switch 224a, and the fourth secondary switch 224b to a combined signal SGC. That is, the common terminal CN of the switch device 300 can be the output terminal for outputting the combined signal SGC. Due to the flexible structure of the switch device 300, the switch device 300 can combine signals of different frequencies with a wider bandwidth comparing to the traditional signal combiner.

Figure 9:
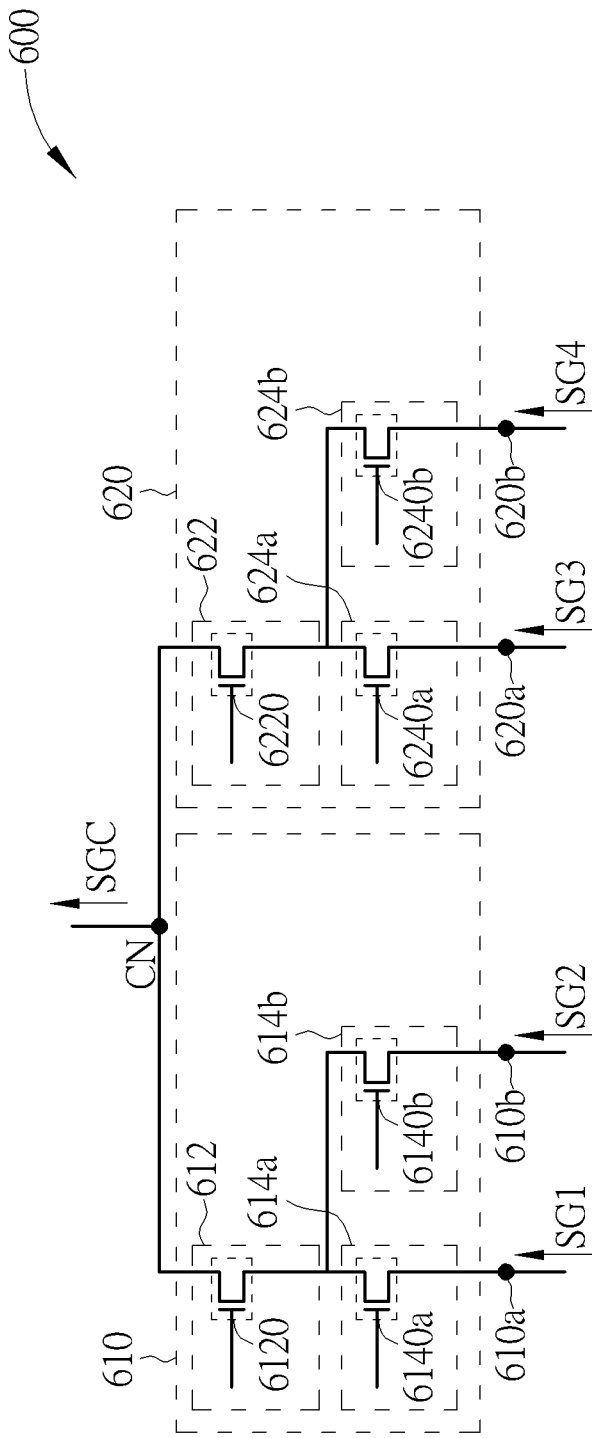
FIG. 9 shows the switch device in FIG. 7 as a signal combiner according to one embodiment of the present invention.

In addition, since the signals SG1 to SG4 may be small signals, the switch device 600 shown in FIG. 7 can also be used as a signal combiner. FIG. 9 shows the switch device 600 being applied as a signal combiner according to one embodiment of the present invention.

In this case, the transmission terminals 610a to 620b coupled to the first secondary switch 614a to the fourth secondary switch 624b can receive the signals SG1 to SG4 respectively and the switch device 600 can combine the signals SG1 to SG4 and output the combined signal SGC through the common terminal CN.

In summary, the switch device provided by the embodiments of the present invention is able to reduce the circuit area, reduce the parasitic capacitance for avoiding the intensity loss of the transmission signal, and prevent the transistors from breaking down or being turned on unintentionally by sharing the primary transistors. Also, with the flexible structure, the switch device can be applied as an RF switch, a power divider or a signal combiner with a wide bandwidth.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch device, comprising:
a common terminal; and
a first selection circuit comprising:
   a first primary switch comprising a plurality of first primary transistors coupled in series to the common terminal;
   a first secondary switch coupled to the first primary switch and a first transmission terminal, the first secondary switch comprising a plurality of first secondary transistors coupled in series; and
   a second secondary switch coupled to the first primary switch and a second transmission terminal, the second secondary switch comprising a plurality of second secondary transistors coupled in series;
wherein a number of the first secondary transistors and a number of the second secondary transistors are both greater than a number of the first primary transistors; and
wherein the plurality of first secondary transistors are turned on and turned off simultaneously, and the plurality of second secondary transistors are turned on and turned off simultaneously.

2. The switch device of claim 1, wherein the first primary switch, the first secondary switch, and the second secondary switch are controlled by negative voltages.

3. The switch device of claim 2, wherein the common terminal, the first transmission terminal, and the second transmission terminal are coupled to external circuits directly without additional capacitors.

4. The switch device of claim 1, further comprising a second selection circuit, comprising:
a second primary switch comprising a plurality of second primary transistors coupled in series to the common terminal;
a third secondary switch coupled to the second primary switch and a third transmission terminal, the third secondary switch comprising a plurality of third secondary transistors coupled in series; and
a fourth secondary switch coupled to the second primary switch and a fourth transmission terminal, the fourth secondary switch comprising a plurality of fourth secondary transistors coupled in series;
wherein, a number of the third secondary transistors and a number of the fourth secondary transistors are both greater than or equal to a number of the second primary transistors.

5. The switch device of claim 4, wherein:
effective capacitances of the first secondary transistors to the fourth secondary transistors are the same as effective capacitances of the first primary transistors to the second primary transistors.

6. The switch device of claim 4, wherein:
effective capacitances of the first secondary transistors to the fourth secondary transistors are the same, effective capacitances of the first primary transistors to the second primary transistors are the same, and the effective capacitances of the first primary transistors to the second primary transistors are greater or smaller than the effective capacitances of the first secondary transistors to the fourth secondary transistors.

7. The switch device of claim 4, wherein:
sizes of the first secondary transistors to the fourth secondary transistors are the same as sizes of the first primary transistors to the second primary transistors.

8. The switch device of claim 4, wherein:
sizes of the first secondary transistors to the fourth secondary transistors are the same, sizes of the first primary transistors to the second primary transistors are the same, and the sizes of the first primary transistors to the second primary transistors are greater or smaller than the sizes of the first secondary transistors to the fourth secondary transistors.

9. The switch device of claim 4, wherein:
breakdown voltages of the first primary transistors to the second primary transistors are greater than breakdown voltages of the first secondary transistors to the fourth secondary transistors.

10. The switch device of claim 4, wherein:
the first secondary switch, the second secondary switch, the third secondary switch, and the fourth secondary switch have a same number of secondary transistors, and the first primary switch and the second primary switch have a same number of primary transistors.

11. The switch device of claim 4, wherein the first primary switch, the first secondary switch, the second secondary switch, the second primary switch, the third secondary switch, and the fourth secondary switch are controlled by negative voltages.

12. The switch device of claim 11, wherein the common terminal, the first transmission terminal, the second transmission terminal, the third transmission terminal, and the fourth transmission terminal are coupled to external circuits directly without additional capacitors.

13. The switch device of claim 4, wherein:
the common terminal is configured to receive a power source;
the switch device is configured to split the power source; and
at least two of the first transmission terminal, the second transmission terminal, the third transmission terminal, and the fourth transmission terminal are configured to output a portion of the power source.

14. The switch device of claim 4, wherein:
at least two of the first transmission terminal, the second transmission terminal, the third transmission terminal, and the fourth transmission terminal are configured to receive a corresponding signal;
the switch device is configured to combine signals received by the first secondary switch, the second secondary switch, the third secondary switch, and the fourth secondary switch to a combined signal; and
the common terminal is configured to output the combined signal.

15. A power divider, comprising:
an input terminal configured to receive a power source; and
a first selection circuit comprising:
  a first primary switch comprising a plurality of first primary transistors coupled to the input terminal;
  a first secondary switch coupled to the first primary switch and a first output terminal configured to output a portion of the power source, the first secondary switch comprising a plurality of first secondary transistors; and
  a second secondary switch coupled to the first primary switch and a second output terminal configured to output a portion of the power source, the second secondary switch comprising a plurality of second secondary transistors;
wherein:
a number of the first secondary transistors and a number of the second secondary transistors are both greater than a number of the first primary transistors;
the plurality of first primary transistors are turned on and turned off simultaneously; and
the plurality of first secondary transistors are turned on and turned off simultaneously, and the plurality of second secondary transistors are turned on and turned off simultaneously.

16. The power divider of claim 15, further comprising:
a second selection circuit, comprising:
  a second primary switch comprising a plurality of second primary transistors coupled to the input terminal;
  a third secondary switch coupled to the second primary switch and a third output terminal configured to output a portion of the power source, the third secondary switch comprising a plurality of third secondary transistors; and
  a fourth secondary switch coupled to the second primary switch and a fourth output terminal configured to output a portion of the power source, the fourth secondary switch comprising a plurality of fourth secondary transistors.

17. The power divider of claim 16, wherein the first secondary switch, the second secondary switch, the third secondary switch, and the fourth secondary switch are not turned on simultaneously.

18. The power divider of claim 17, wherein
a number of the plurality of third secondary transistors and a number of the plurality of fourth secondary transistors are both greater than or equal to a number of the plurality of second primary transistors.

19. The power divider of claim 17, wherein:
the first primary switch comprises a plurality of first primary transistors coupled in series;
the second primary switch comprises a plurality of second primary transistors coupled in series;
the first secondary switch comprises a plurality of first secondary transistors coupled in series;
the second secondary switch comprises a plurality of first secondary transistors coupled in series;
the third secondary switch comprises a plurality of first secondary transistors coupled in series; and
the fourth secondary switch comprises a plurality of first secondary transistors coupled in series.

20. A signal combiner, comprising:
an output terminal configured to output a combined signal; and
a first selection circuit comprising:
  a first primary switch comprising a plurality of first primary transistors coupled to the output terminal;
  a first secondary switch coupled to the first primary switch and a first input terminal configured to receive a first signal, the first secondary switch comprising a plurality of first secondary transistors; and
  a second secondary switch coupled to the first primary switch and a second input terminal configured to receive a second signal, the second secondary switch comprising a plurality of second secondary transistors;
wherein:
a number of the first secondary transistors and a number of the second secondary transistors are both greater than a number of the first primary transistors;

the plurality of first primary transistors are turned on and turned off simultaneously; and the plurality of first secondary transistors are turned on and turned off simultaneously, and the plurality of second secondary transistors are turned on and turned off simultaneously.

21. The signal combiner of claim 20, further comprising a second selection circuit, comprising:
- a second primary switch comprising a plurality of second primary transistors coupled to the output terminal;
- a third secondary switch coupled to the second primary switch and a third input terminal configured to receive a third signal, the third secondary switch comprising a plurality of third secondary transistors; and
- a fourth secondary switch coupled to the second primary switch and a fourth input terminal configured to receive a fourth signal, the fourth secondary switch comprising a plurality of fourth secondary transistors.

* * * * *